United States Patent [19]

Sellers

[11] Patent Number: 5,431,165
[45] Date of Patent: Jul. 11, 1995

[54] MRI MAGNETS

[75] Inventor: Michael B. Sellers, Witney, England

[73] Assignee: Oxford Magnet Technology Limited, Eynsham, United Kingdom

[21] Appl. No.: 177,820

[22] Filed: Jan. 4, 1994

[30] Foreign Application Priority Data

Apr. 8, 1993 [GB] United Kingdom ............... 9307380

[51] Int. Cl.⁶ ............................................. A61B 5/055
[52] U.S. Cl. .............................. 128/653.5; 324/318; 335/306
[58] Field of Search .................. 128/653.5, 653.2; 324/318, 319, 320; 335/296, 302, 306

[56] References Cited

U.S. PATENT DOCUMENTS

| | | |
|---|---|---|
| 4,673,882 | 6/1987 | Buford . |
| 4,682,111 | 7/1987 | Hughes . |
| 4,703,276 | 10/1987 | Beer ........................... 335/306 X |
| 4,953,555 | 9/1990 | Leopold et al. ............. 324/318 X |
| 4,983,942 | 1/1991 | Benesch . |
| 5,003,276 | 3/1991 | Sarwinski et al. .......... 335/306 X |
| 5,045,794 | 9/1991 | Dorri et al. ..................... 324/320 |
| 5,063,934 | 11/1991 | Rapoport et al. ............ 128/653.5 |
| 5,134,374 | 7/1992 | Breneman et al. .......... 324/318 X |
| 5,194,810 | 3/1993 | Breneman et al. ................. 324/319 |
| 5,207,224 | 5/1993 | Dickinson et al. ........... 324/318 X |
| 5,235,284 | 8/1993 | Tahara et al. ...................... 324/320 |

FOREIGN PATENT DOCUMENTS

| | | |
|---|---|---|
| 0192331 | 8/1986 | European Pat. Off. . |
| 0407227 | 1/1991 | European Pat. Off. . |
| 0432750 | 6/1991 | European Pat. Off. . |
| 0488015A1 | 6/1992 | European Pat. Off. . |
| 59-60346 | 4/1984 | Japan . |
| 1360606 | 7/1974 | United Kingdom . |
| 84/00611 | 2/1984 | WIPO . |

Primary Examiner—Lee S. Cohen
Assistant Examiner—Brian L. Casler
Attorney, Agent, or Firm—Keck, Mahin & Cate

[57] ABSTRACT

A magnet for magnetic resonance imaging comprising a pair of poles supported on a yoke and juxtaposed to define between them an imaging volume, the poles having opposed end faces which each include shim pieces set therein, which shim pieces are adapted and arranged to be positionally adjustable in directions parallel with the longitudinal axis of the poles for the purpose of homogenizing the magnetic field in the imaging volume.

12 Claims, 3 Drawing Sheets

MRI MAGNETS

This invention relates to magnets and more especially it relates to magnets of the kind used for magnetic resonance imaging (MRI) in medical applications.

The theory and operation of MRI is well known and will not therefore be discussed in detail herein. It should be emphasised however that in order to create acceptable images, a magnetic field must be provided which affords a predetermined volume of highly homogeneous magnetic flux. This volume, which is usually called the imaging volume, might be considered to be spherical and typically of about 40 cm diameter wherein the magnetic flux is substantially homogeneous to within one hundred parts per million or less of non-uniformity ($\Delta B/B$).

The magnets used for MRI may be permanent magnets or electro magnets which may employ cryogenic techniques to produce strong magnetic fields, typically 0.2 T to 2 T. Unfortunately, with all presently known magnets, the magnet alone, i.e. the bare magnet will not produce a magnetic field in the imaging volume which is sufficiently homogeneous. This is because of inevitable non-uniformities inherent in a magnet's design, the materials and tolerances of the component parts from which it is made and external influences which affect the magnet's field during operation. It is therefore necessary to correct for these magnetic flux non-uniformities, a process known as shimming.

Shimming is a technique well known to those skilled in the art and various shimming methods may be used, perhaps in combination. For example, electrical shimming may be used which comprises positioning specially designed copper coils, often with complex geometries within the magnet and energising the coils with a predetermined current. The magnetic field thereby produced from these coils is superimposed on the field produced by the bare magnet so as to create a substantially homogeneous magnetic field in the imaging volume.

Although electrical shimming is a very powerful technique, it carries a major cost penalty. The additional cost of coils and the requirement for a very stable power supply often mitigates against the use of electrical shimming.

An alternative shimming method called passive shimming comprises positioning discrete pieces of magnetic material which may either be ferro-magnetic or permanently magnetised near the imaging volume in predetermined positions in order to constrain the field of the bare magnet so as to make it more homogeneous. The main shortcoming of passive shimming is that relatively large volumes of shimming materials are often required and space for this is not always available.

When considering shimming designs however, the effect of temperature changes must be considered since available materials possess a significant temperature sensitivity which means that the homogeneity of the magnetic field in the imaging volume will be temperature sensitive to some degree. As is well known by the cognoscenti, MRI involves the use of gradient coils which are energised to create a magnetic field gradient across the imaging volume, the coils being electrically pulsed on and off during imaging. Thus heat is inevitably produced in the gradient coils which in turn may affect the homogeneity of the magnetic field in the imaging volume if temperature sensitive materials are used in any quantity.

This invention relates to magnets in which the imaging volume is defined in a region between two pole pieces which are held apart by a frame or 'yoke'. In such a magnet, a further technique which may be used to produce a substantially homogeneous magnetic field in the imaging volume is pole shaping. This may involve a special separate flexible pole plate which is spaced apart from the main pole of the magnet by an air gap as described in European patent application number 91119667.3. By locally flexing the pole plate so as to change the air gap, it is possible to Vary the magnetic flux passing through the pole plate. Since the, perpendicular flux through the plate affects magnetic field distribution in the imaging volume, the homogeneity of the magnetic field can be improved by predetermined pole plate adjustment. The use of flexible pole plates for shimming is however not entirely satisfactory. This is because the shimming process is complex and time consuming and achieving the necessary resolution for a homogeneous magnetic field in the imaging volume is very difficult. Additionally, the mechanical robustness of flexible pole plates is not good.

A separate pole plate does however have one special significant advantage in that the adverse effect of hysteresis can be largely eliminated. Magnets made of cheap mild steel suffer particularly from this phenomenon, which manifests itself in a deterioration of the homogeneity of the magnetic field in the imaging volume when the gradient coils are pulsed. However, a separate pole plate acts as a screen which serves to carry all of the gradient coil's return flux and does not allow any to penetrate through to the main pole. By careful choice of material and construction method for the pole plate, hysteresis effects may thus be substantially eliminated.

It is an object of the present invention therefore to provide an improved shimming method wherein some of the foregoing disadvantages are obviated at least in part.

According to the present invention a magnet for magnetic resonance imaging comprises a pair of poles supported on a yoke and juxtaposed to define between them an imaging volume, the poles having opposed end faces which each include shim pieces set therein, which shim pieces are adapted and arranged to be positionally adjustable in directions parallel with the longitudinal axis of the poles for the purpose of homogenising the magnetic field in the imaging volume.

Each pole may have a substantially rigid pole plate which is provided on its end face and disposed substantially orthogonally of the said axis, the pole plate being spaced apart from the end face of the pole with which it is associated.

By using separated rigid pole plates the adverse effect of hysteresis is substantially removed, without the disadvantage associated with flexible pole plates and by providing axially adjustable shim pieces set into the poles, the homogeneity of the magnetic field in the imaging volume may be simply optimised.

The shim pieces may be fabricated of ferro-magnetic material.

Alternatively, the shim pieces may be fabricated of permanent magnetic material which may additionally include ferro-magnetic material.

The shim pieces may comprise at least one annular ring, the position of which is arranged to be adjustable axially of the poles.

A plurality of concentric rings might be provided, each ring being individually adjustable.

At least one ring may be segmented, each segment of the ring being adapted and arranged for individual adjustment.

The shim pieces may be adapted and arranged for screw threaded adjustment.

Each segment may comprise means for individual screw threaded adjustment.

The shim pieces may be arranged to be adjustable against the biasing force of a spring.

In one contemplated embodiment of the invention the rigid pole plate for each pole may be sandwiched between, on one side thereof, the end face of the pole with which it is associated, and into which the shim pieces are adjustably let, and on the other side thereof gradient coils, a cylindrical space on each pole within which the pole plate and the gradient coils are accommodated being embraced by a pair; of annular Rose rings, one for each pole, which are mounted on the end face of respective poles. (NB—The 'Rose' ring is named after its inventor. Its purpose is to improve the basic homogeneity of the field. It is well known in the art, although usually described by its shape and function rather than called a 'Rose' ring.)

The pole plate associated with each pole may be arranged to serve as a substrate on which permanent magnets provided for fine shimming are mounted.

One embodiment of the invention will now be described by way of example only with reference to the accompanying drawings, in which.

Figure 1:
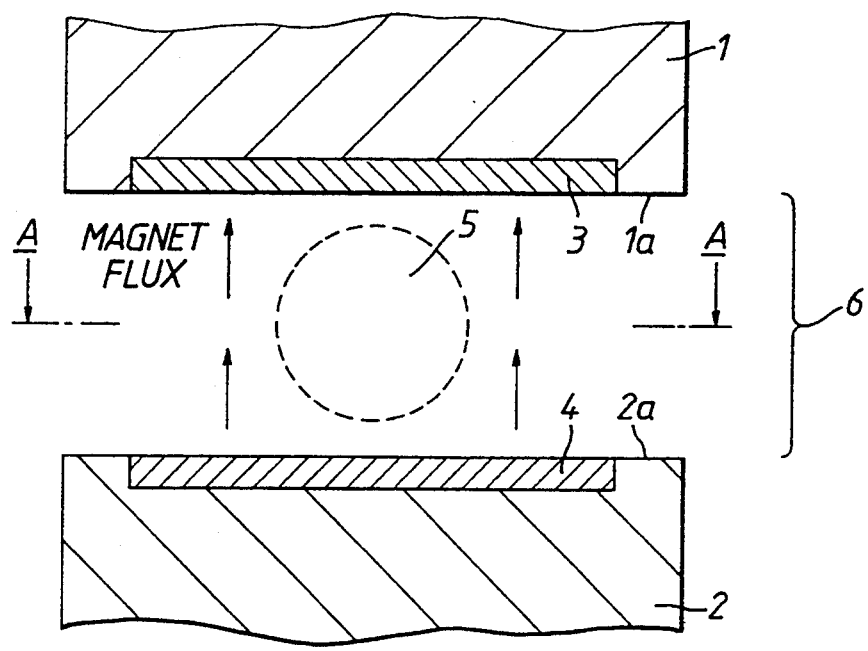
FIG. 1 is a somewhat schematic side view of the poles of a known MRI magnet.
Figure 1:
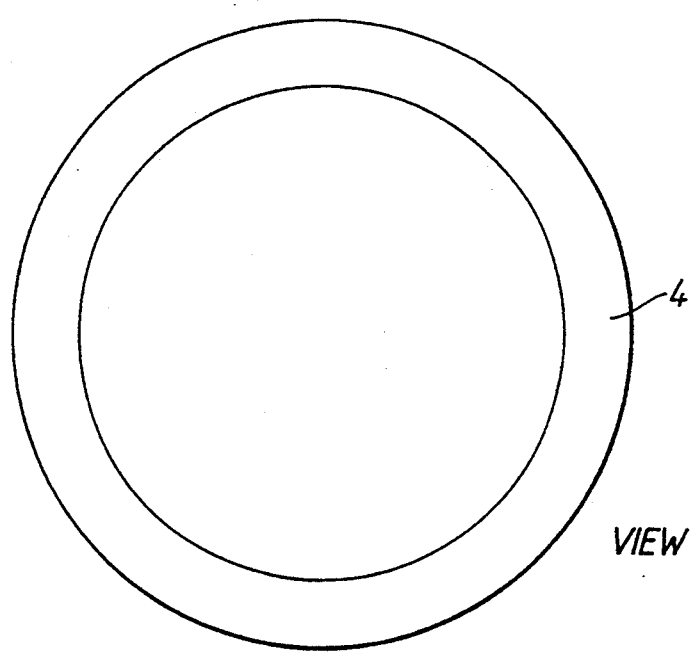

Referring now to FIG. 1, a known magnet for MRI comprises a pair of poles 1 and 2. The poles 1 and 2 have end faces 1a and 2a respectively into which annular gradient coils 3 and 4 are let. In order to produce satisfactory images the magnetic flux in a spherical imaging volume 5, having a diameter of about 40 cm is required to be substantially homogeneous to within one hundred parts per million or less of non-uniformity ($\Delta B/B$). The imaging volume 5 is positioned in the centre of a gap 6 between the poles 1 and 2 into which a patient to be scanned is positioned so that a body region to be scanned is within the imaging volume 5.

As hereinbefore explained, MRI magnet systems are very well known and the arrangement just before described, and its mode of operation is well understood by those skilled in the art.

Figure 2:
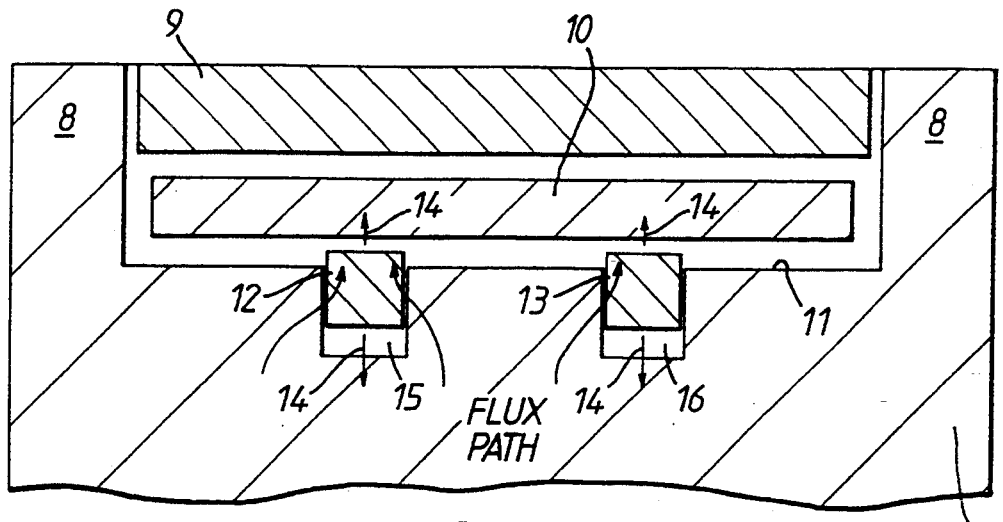
FIG. 2 is a side view of one pole of an MRI magnet according to one embodiment of this invention.
Figure 4:
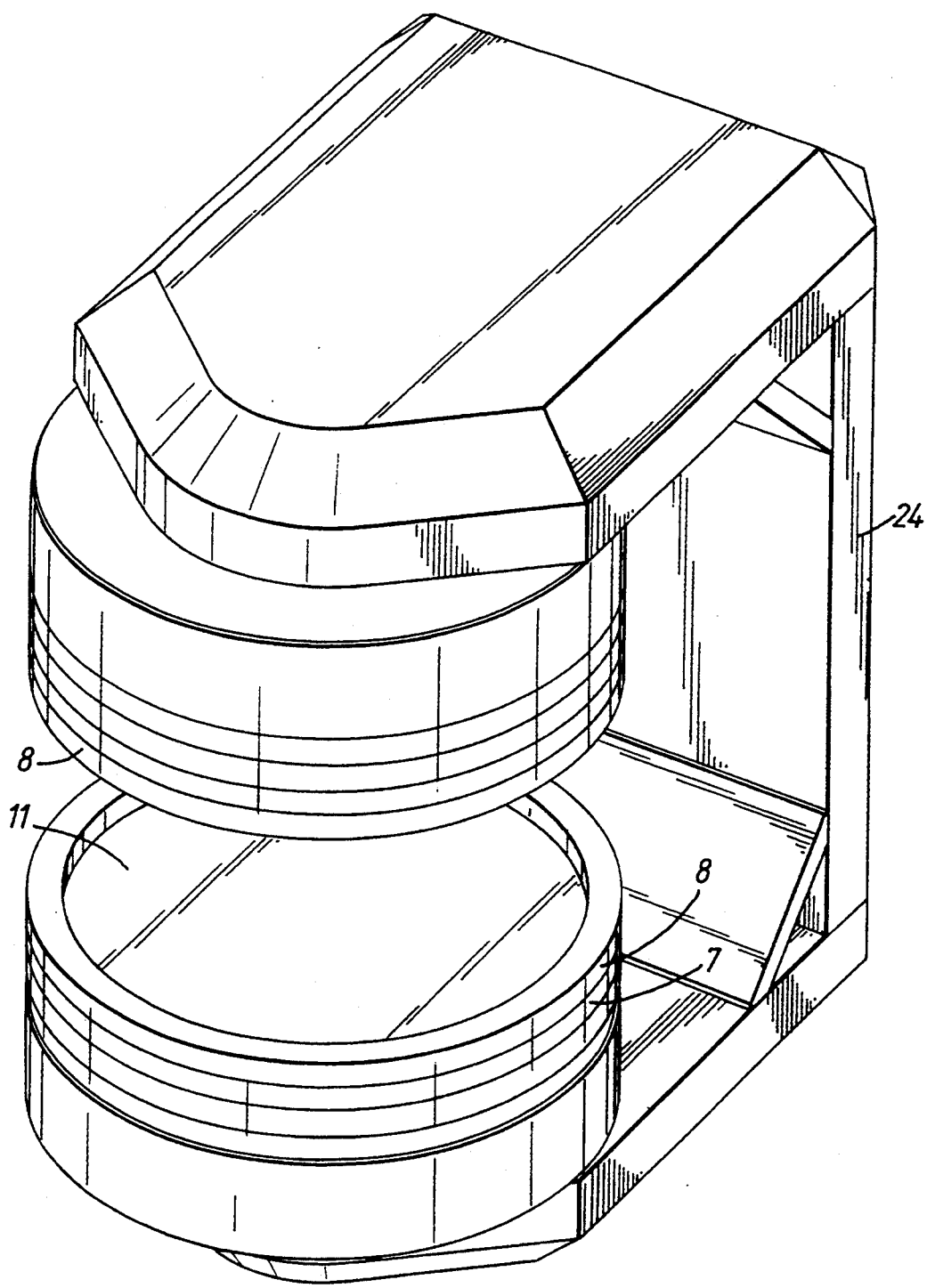
FIG. 4 is a generally schematic view of an MRI magnet wherein parts corresponding to the previous FIGS. 2 and 3 bear the same numerical designations.

Referring now to FIG. 2, one pole of a magnet according to the present invention is shown but it will be understood that the magnet will comprise two poles as shown in FIG. 4, each similar to the pole shown in FIG. 2 but arranged in juxtaposed positional relationship. In FIG. 2 a pole 7 is shown on which is mounted an annular Rose ring 8 so as to define within the ring a cylindrical space which is occupied by gradient coils 9 and a fixed and rigid pole plate 10. The pole plate 10 is sandwiched between the gradient coil 9 and an end face 11 of the pole 7 into which adjustable shim pieces 12 and are let. The shim pieces 12 and 13 are individually adjustable and comprise segments of an annular ring which is let in to the pole face 11 of the pole 7. The shim pieces 12 and 13 are arranged to be adjustable in directions as indicated by arrows 14, parallel with the longitudinal axis of the pole 7. In order to minimise the reluctance in magnetic paths associated with the pole 7 and the shim pieces 12 and 13, the shim pieces 12 and 13 are arranged to be a close fit within apertures 15 and 16 respectively in the pole face 11 into which they are slidably fitted.

Although any suitable method for adjustment of the shim pieces 12 and 13 may be employed, one adjustment arrangement will now be described with reference to FIG. 3.

Figure 3:
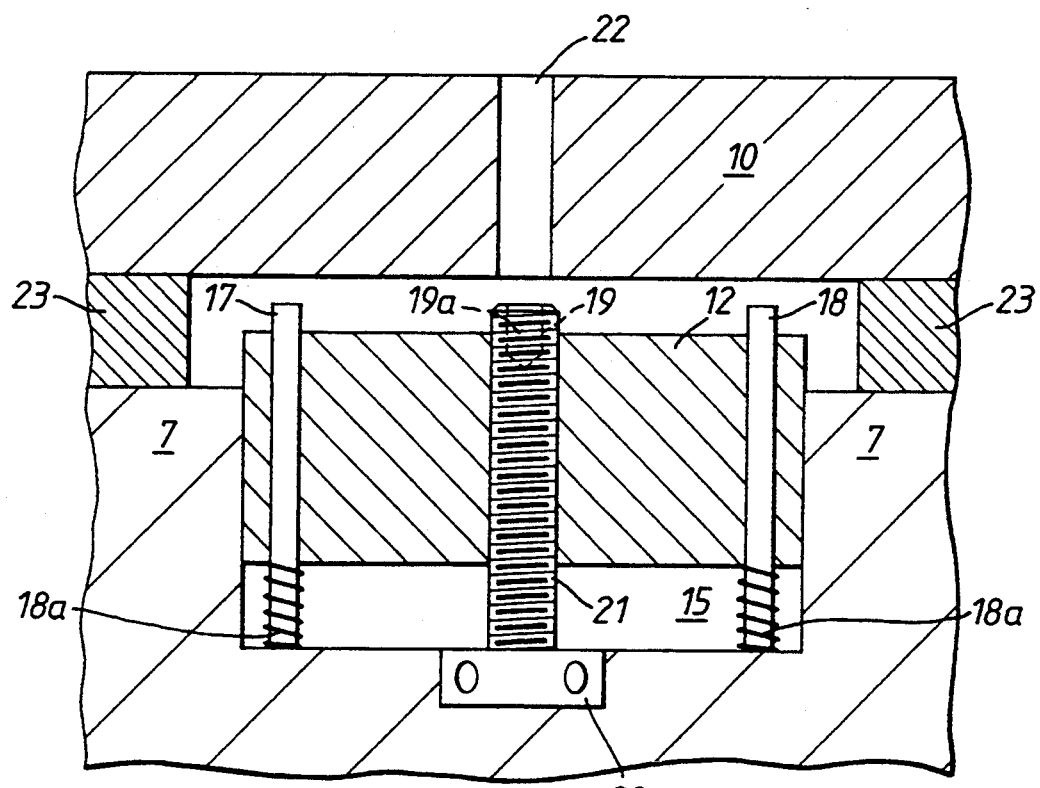
FIG. 3 is a somewhat schematic sectional side view of a part of the pole shown in FIG. 2.

Turning now to FIG. 3, wherein parts corresponding to FIG. 2 bear the same numerical designations, the shim piece 12 is mounted on dowels 17 and 18, adjustment being effected by means of a screw 19 having a fine screw thread. The screw 19 is arranged to be axially fixed by means of an anchoring arrangement 20 and arranged to co-operate with complementary screw threads 21 formed in the shim piece 12 so that consequent upon rotation of the screw 19, the axial position of the shim piece 12 will be adjusted against the biasing force of coil springs 18a which embrace the dowels 18. Adjustment may be affected by means of a key (not shown) which is arranged to fit in a complementary aperture 19a in one end of the screw 19, an access hole 22 for the key being provided in the pole plate 10 which is mounted on non-magnetic rings 23, and which serves as a platform for discrete magnets (not shown) as may be required for passive fine shimming.

The plate 10 might normally be secured to the plate 7 by screws (not shown) which pass through the rings 23.

It will be appreciated that shim pieces such as the shim piece 12, may comprise any combination and number of segmented rings which can be fitted to the poles at any radius. These shim pieces may be arranged to fit closely within complementary grooves of any width or depth within the pole with which they are associated. In fact the segments may be so small as to comprise individual screws.

Incremental movements of the shim pieces or segments may simply be measured with a dial test indicator which can be used via measurement holes in the pole plate provided as necessary for the purpose.

As shown in FIG. 4, use of a magnet according to the present invention facilitates the fabrication of MRI apparatus wherein the imaging volume, and hence the patient, is accessible to medical personnel during imaging, so that dynamic techniques become possible for diagnosis and/or other purposes. The magnet shown has a yoke 24 in the form of a 'C'. It will be appreciated by those skilled in the art that other geometries can be used without in way affecting the present invention.

I claim:

1. A magnet for magnetic resonance imaging comprising a pair of poles supported on a yoke and juxtaposed to define between them an imaging volume, the poles having opposed end faces which each includes shim pieces set therein, and means for positionally adjusting the shim pieces in directions parallel with the longitudinal axis of the poles for homogenising the magnetic field in the imaging volume;

wherein each pole has a substantially rigid pole plate disposed on its end face and substantially orthogonally of the axis, the pole plate being spaced apart from the end face of the pole with which it is associated; and wherein the rigid, pole plate for each pole is sandwiched between, on one side thereof, the end face of the pole with which it is associated, and into which the shim pieces are set therein, and on the other side thereof gradient coils, further wherein each pole includes a cylindrical space within which the pole plate and the gradient coils are disposed and embraced by a pair of annular 'Rose' rings, one for each pole, which are mounted on the end face of respective poles.

2. A magnet as claimed in claim 1, wherein the shim pieces are fabricated of ferro-magnetic material.

3. A magnet as claimed in claim 1, wherein the shim pieces are fabricated of permanent magnetic material which may additionally include ferro-magnetic material.

4. A magnet as claimed in claim 1, wherein the shim pieces comprise at least one annular ring, the position of which is arranged to be adjustable axially of the poles.

5. A magnet as claimed in claim 4, comprising a plurality of concentric rings, each ring being individually adjustable.

6. A magnet as claimed in claim 4, wherein at least one ring is segmented, each segment of the ring being adapted and arranged for individual adjustment.

7. A magnet as claimed in claim 6, wherein each segment comprises means for individual screw threaded adjustment.

8. A magnet as claimed in claim 1, wherein the means for positionally adjusting the shim pieces is a thread adjuster.

9. A magnet as claimed in claim 1, further comprising a spring in contact with the shim pieces, wherein the spring applies a biasing force and wherein the shim pieces are adjustable against the biasing force of the spring.

10. A magnet as claimed in claim 1, further comprising a plurality of discrete permanent magnets mounted on the poles allowing fine shimming adjustment.

11. A magnet as claimed in claim 1, wherein the pole plate associated with each pole is arranged to serve as a substrate on which permanent magnets provided for fine shimming are mounted.

12. An improved magnetic resonance imaging system having support means for supporting a body to be scanned, a magnetic arrangement for scanning the body and control means for controlling the magnetic arrangement, wherein the improvement comprises a magnetic arrangement comprising a pair of poles supported on a yoke and juxtaposed to define between them an imaging volume, the poles having opposed end faces which each include shim pieces set therein;

means positionally adjusting the shim pieces in directions parallel with the longitudinal axis of the poles for homogenising the magnetic field in the imaging volume;

wherein each pole has a substantially rigid pole plate disposed on its end face and substantially orthogonally of the axis, the pole plate being spaced apart from the end face of the pole with which it is associated; and wherein the rigid pole plate for each pole is sandwiched between, on one side thereof, the end face of the pole with which it is associated and into which the shim pieces are set therein, and on the other side thereof gradient coils, further wherein each pole includes a cylindrical space within which the pole plate and the gradient coils are disposed and embraced by a pair of annular 'Rose' rings, one for each pole, which are mounted on the end face of respective poles.

* * * * *